(12) United States Patent
Rusconi Clerici Beltrami et al.

(10) Patent No.: US 11,516,583 B2
(45) Date of Patent: Nov. 29, 2022

(54) AMPLIFIER UNIT FOR A SOUND CONVERTER, AND SOUND-GENERATING UNIT

(71) Applicant: USound GmbH, Graz (AT)

(72) Inventors: Andrea Rusconi Clerici Beltrami, Vienna (AT); Ferruccio Bottoni, Graz (AT); Markus Haensler, Heiligenkreuz am Waasen (AT)

(73) Assignee: USound GmbH, Graz (AT)

( * ) Notice: Subject to any disclaimer, the term of this patent is extended or adjusted under 35 U.S.C. 154(b) by 102 days.

(21) Appl. No.: 16/494,105

(22) PCT Filed: Mar. 16, 2018

(86) PCT No.: PCT/EP2018/056668
§ 371 (c)(1),
(2) Date: Feb. 22, 2021

(87) PCT Pub. No.: WO2018/167272
PCT Pub. Date: Sep. 20, 2018

(65) Prior Publication Data
US 2021/0227324 A1   Jul. 22, 2021

(30) Foreign Application Priority Data

Mar. 16, 2017 (DE) .......................... 10 2017 105 594

(51) Int. Cl.
*H04R 3/12* (2006.01)
*B81B 3/00* (2006.01)
*H04R 1/10* (2006.01)

(52) U.S. Cl.
CPC ............. *H04R 3/12* (2013.01); *B81B 3/0024* (2013.01); *H04R 1/1083* (2013.01); *B81B 2201/0257* (2013.01); *H04R 2201/003* (2013.01)

(58) Field of Classification Search
None
See application file for complete search history.

(56) References Cited

U.S. PATENT DOCUMENTS 4,002,860 A * 1/1977 Terai .................. H04B 1/58
                                                       381/163
5,907,538 A * 5/1999 White ................ H04M 1/6033
                                                       379/403

(Continued)

FOREIGN PATENT DOCUMENTS

| DE | 10 2007 057664 | 6/2009 |
| DE | 20 2009 009804 | 10/2009 |
| WO | WO 2009/120709 | 10/2009 |

OTHER PUBLICATIONS

German Search Report, DE Application No. 10 2017 105 594.0, dated Dec. 13, 2017, 16 pages.

(Continued)

*Primary Examiner* — Paul W Huber
(74) *Attorney, Agent, or Firm* — Dority & Manning, P.A.

(57) ABSTRACT

The invention relates to an amplifier unit for a MEMS sound transducer, which is operable as a microphone and as a loudspeaker, comprising at least one audio amplifier for sound reproduction and/or sound recording. According to the invention, the amplifier unit is designed in such a way that the MEMS sound transducer provided therefor is simultaneously operable as a loudspeaker and as a microphone. Moreover, the invention relates to sound-generating unit comprising a MEMS sound transducer, which is operable as a microphone and as a loudspeaker, and an amplifier unit coupled to the sound transducer for sound reproduction and/or sound recording.

20 Claims, 7 Drawing Sheets

(56) References Cited

U.S. PATENT DOCUMENTS

| | | |
|---|---|---|
| 9,544,673 B2 * | 1/2017 | Lewis .................... H04R 1/04 |
| 10,141,494 B2 | 11/2018 | Kuhtz et al. |
| 2004/0142680 A1 | 7/2004 | Jackson et al. |
| 2005/0063533 A1 | 3/2005 | Dettmer |
| 2006/0034472 A1 | 2/2006 | Bazarjani et al. |
| 2011/0164754 A1 | 7/2011 | Gleissner et al. |
| 2013/0156253 A1 * | 6/2013 | Lemarquand .......... H04R 23/00 381/396 |
| 2015/0356285 A1 | 12/2015 | Glaser |
| 2016/0182987 A1 | 6/2016 | Lewis et al. |

OTHER PUBLICATIONS

International Search Report and English Translation Thereof, PCT Application No. PCT/EP2018/056668, dated May 25, 2018, 18 pages.

* cited by examiner

AMPLIFIER UNIT FOR A SOUND CONVERTER, AND SOUND-GENERATING UNIT

CROSS REFERENCE TO RELATED APPLICATIONS

The present application claims priority to Application serial No. PCT/EP2018/056668, filed Mar. 16, 2018, which is hereby incorporated herein by this reference for all purposes.

FIELD OF THE INVENTION

The present invention relates to an amplifier unit for a sound transducer, in particular a MEMS sound transducer, which is operable as a microphone and as a loudspeaker, comprising at least one audio amplifier for sound reproduction and/or sound recording. Moreover, the invention relates to a sound-generating unit comprising a sound transducer, in particular a MEMS sound transducer, which is operable as a microphone and as a loudspeaker, and an amplifier unit coupled to the sound transducer for sound reproduction and/or sound recording.

BACKGROUND OF THE INVENTION

Devices and methods for noise cancellation, so-called active noise reduction (ANR) methods or active noise cancellation (ANC) methods are known from the prior art. Devices of this type are arranged, for example, in headphones or headsets, wherein disturbing ambient noise is reduced for the purpose of noise cancellation in that the ambient noise is initially recorded by a microphone arranged on the headphone. On the basis of the recorded acoustic signal, the device generates an anti-noise appropriate for the ambient noise, which is played back by a loudspeaker of the headphones in addition to the music. The anti-noise and the ambient noise cancel each other out via destructive interference, so that only the music and, in particular, no ambient noise, reaches the wearer of the headphones.

US 2016/0182987 A1, which is incorporated herein by this reference for all purposes, describes a device comprising a microphone and comprising a driver arrangement. The device comprises a microphone driver and a loudspeaker driver, which operate a sound transducer, wherein the sound transducer can be utilized as a microphone and as a loudspeaker. The disadvantage of this device is that an ANR method cannot be carried out with the aid of this device.

OBJECTS AND SUMMARY OF THE INVENTION

The primary object of the present invention is therefore to create a device, with the aid of which ambient noise can be effectively suppressed.

The primary object is achieved by means of embodiments of an amplifier unit and a sound-generating unit having the features described herein.

The invention relates to an amplifier unit for a MEMS sound transducer, which is operable as a microphone and as a loudspeaker. The amplifier unit can therefore be a MEMS amplifier unit or a MEMS sound transducer amplifier unit. The MEMS sound transducer can be referred to in the following as a sound transducer for the sake of simplicity.

The amplifier unit can be utilized, for example, for carrying out an active noise reduction (ANR) method or an active compensation for ambient noise. The sound transducer as well as the amplifier unit, which operates the sound transducer, are arranged, for example, in headphones, a headset, in-ear headphones, a helmet comprising headphones, or a mobile phone, in order to provide the wearer or the user with a higher quality of music, tones, and/or speech, in that ambient noise is reduced with the aid of the amplifier unit. In the ANR method, the ambient noise is cancelled out, for example, with the aid of anti-noise. The active compensation can be distinguished by the fact that the ambient noise is cancelled out with the aid of the anti-noise. A passive compensation of ambient noise could be formed, for example, by a sound insulation of the headphones.

Furthermore, the amplifier unit comprises at least one audio amplifier for sound reproduction and/or for sound recording. The audio amplifier can process and/or condition, for example, the acoustic signals recorded by the sound transducer when the sound transducer is operated as a microphone. For example, the audio amplifier can process the acoustic signals in such a way that they can be digitally stored.

With the aid of the audio amplifier, for example, audio signals entering the amplifier unit can also be processed when the sound transducer is operated as a loudspeaker. In this case, the audio amplifier can process and/or condition the audio signals in such a way that they can be converted by the sound transducer into sound waves, for example, tones, music, and/or speech.

According to the invention, the amplifier unit is designed in such a way that the sound transducer provided therefor is operable simultaneously as a loudspeaker and as a microphone. The simultaneous operation of the sound transducer as a loudspeaker and as a microphone can mean, for example, that a wearer of the headphones in which the amplifier unit is arranged gets the impression that the sound transducer can simultaneously reproduce sound as a loudspeaker and record sound as a microphone.

As described above, in the active noise reduction method, ambient noise is recorded by a microphone. On the basis thereof, the anti-noise is generated, which is output with the music, preferably at the same time, by a loudspeaker in the headphones. The anti-noise component of the music interferes with the ambient noise and cancels it out. The music remains, wherein the user does not hear the ambient noise. In particular, with the aid of the sound transducer, the ambient noise can be recorded and, at the same time, the corresponding anti-noise can be played back with the music. The ambient noise and the anti-noise cancel each other out via destructive interference, so that only the music remains.

Due to the simultaneous operation of the sound transducer as a microphone and a loudspeaker, a microphone for recording ambient noise or the loudspeaker for outputting only the anti-noise can be advantageously dispensed with, since the sound transducer of the amplifier unit according to the invention simultaneously records the ambient noise and plays back the corresponding anti-noise in addition to the music. As a result, the ANR method can be carried out with the aid of only one sound transducer, so that the headphones can be manufactured at lower cost. The sound quality is enhanced due to the fact that the sound, in particular the ambient noise, is recorded and the music is reproduced by the sound transducer at one spot. With the aid of a sound transducer as a loudspeaker and a microphone, the anti-noise is generated at the spot at which the associated ambient noise prevails, so that the anti-noise is precisely matched to the associated ambient noise.

In addition, a speed of the ANR method can be carried out faster, since a propagation time of the sound between the spot of the recording of the ambient noise and the spot of the reproduction of the anti-noise does not need to be taken into account.

In an advantageous enhanced embodiment of the invention, the amplifier unit comprises a processor, with the aid of which the sound transducer provided therefor can be utilized as a microphone at the same time as the sound generation. The processor can also be designed as a digital signal processor. The processor can comprise, for example, an arithmetic logic unit in which a computer program is run, which filters the ambient noise out of the recorded acoustic signal and, on the basis thereof, generates the anti-noise. The processor can also operate the at least one audio amplifier. Advantageously, the processor can conduct the anti-noise to the audio amplifier, which is connected to the sound transducer for sound reproduction, in order to play back the anti-noise, preferably with the music.

It is also advantageous when the processor is designed, for sound cancellation, in such a way that it can filter out and/or suppress ambient noise on the basis of the emitted audio signal and the acoustic signal detected at the same time with the aid of the same sound transducer. The processor forms the anti-noise on the basis of the ambient noise and returns the anti-noise to the sound transducer, which, as a loudspeaker, outputs the anti-noise together with the music.

It is advantageous when the processor is designed in such a way that it separates an acoustic signal, which is detected by the MEMS sound transducer operating as a microphone, into a first acoustic signal component representing the emitted useful sounds and into a second acoustic signal component representing the ambient noise. The useful sounds include, for example, music, tones, and speech, which are to be made available for a listener. The ambient noise, on the other hand, is disturbing noise. As a result, the ambient noise can be further processed. On the basis of the ambient noise, the anti-noise can be generated, which cancels out the ambient noise.

Advantageously, the ambient noise can be filtered out of the detected acoustic signal or can be separated therefrom, in that a difference signal is formed. Since, in the case of the simultaneous operation of the sound transducer as a loudspeaker and as a microphone, the acoustic signals detected with the aid of the sound transducer as a microphone include the ambient noise and the useful sounds, the ambient noise can be separated from the detected acoustic signal with the aid of difference formation. The useful sounds are known in this case, since they correspond to the audio signal generated by the loudspeaker. The detected acoustic signal therefore includes a first acoustic signal component, which originates from the sound waves generated according to the audio signal or includes the useful sounds, and a second acoustic signal component, which originates from the ambient noise. For example, the first acoustic signal component can be filtered out of or separated from the acoustic signal, in particular being subtracted therefrom, so that only the second acoustic signal component remains, which includes the ambient noise. One advantage thereof is that the first acoustic signal component is known, since it corresponds to the audio signal, according to which the sound waves are generated, which, in turn, include at least music, tones, and speech.

It is also advantageous when the processor is designed in such a way that it generates an anti-noise signal on the basis of the second acoustic signal component and combines the anti-noise signal with an input signal including useful sound to form the audio signal. The input signal can include, for example, the speech, the music, or the tones. The input signal can originate, for example, from a music file. Furthermore, the processor can generate the anti-noise signal, which cancels out the ambient noise when sound waves are generated on the basis thereof. Furthermore, the processor can combine the anti-noise signal and the input signal to form the audio signal, which is sent to the MEMS sound transducer, which generates appropriate sound waves The sound waves then include the useful sounds, which encompass the music, the tones, or the speech, and the anti-noise, which cancels out the ambient noise.

Furthermore, it is advantageous when the processor is designed in such a way that it can switch the MEMS sound transducer between the operation as a loudspeaker and the operation as a microphone. For this purpose, the processor can comprise, for example, a switching unit, which can switch the sound transducer between the operation as a loudspeaker and the operation as a microphone. If the processor switches sufficiently rapidly between the operation of the sound transducer as a loudspeaker and the operation as a microphone, this can give a person the impression that the sound transducer is operated as a loudspeaker and as a microphone at the same time or simultaneously. For example, the sound transducer can be operated as a loudspeaker in a loudspeaker interval and can be operated as a microphone in a microphone interval. Advantageously, the loudspeaker interval and the microphone interval can alternate. If these two intervals alternate sufficiently rapidly, this can be perceived as the sound transducer generating and detecting the sound waves at the same time. The processor can switch between the loudspeaker interval and the microphone interval in this case.

It is also advantageous when the amplifier unit comprises a hybrid audio amplifier, with the aid of which the audio signal can be output to the sound transducer provided therefor, for sound reproduction, and the acoustic signal of the sound transducer can be received, for sound recording. The hybrid audio amplifier is therefore designed in such a way that it can send the audio signal to the sound transducer and, at the same time, receive the acoustic signal, which includes music and ambient noise, from the same sound transducer. The hybrid audio amplifier can be connected to the sound transducer via a single audio line.

It is also advantageous when the amplifier unit comprises a loudspeaker amplifier for the sound reproduction of the audio signal and a microphone amplifier for the sound recording of the acoustic signal As a result, each of the two amplifiers can be specialized for their particular task. The loudspeaker amplifier can be optimized for preconditioning the audio signal for sound reproduction for the sound transducer. The microphone amplifier can also be optimized in order to process the acoustic signal recorded by the microphone. Since the acoustic signal includes the music and the ambient noise, the microphone amplifier can be optimized in such a way that it separates the ambient noise from the music. Subsequently, the ambient noise can be processed in order to generate the anti-noise on the basis thereof. The two amplifiers can each be individually connected to the sound transducer with the aid of audio lines. Alternatively, the two audio lines coming from the amplifiers can initially be combined, so that only one audio line leads to the sound transducer.

Furthermore, it is advantageous when the audio amplifier is designed in such a way that a MEMS sound transducer is operable with the aid thereof. The MEMS sound transducer can also be a piezoelectric MEMS sound transducer. The MEMS sound transducer can be designed to be particularly space-saving and has only a low power consumption, so that, for example, battery-operated headphones have a long service life. In addition, the MEMS sound transducer is easily operable as a loudspeaker with the aid of electrical signals. Furthermore, in particular the piezoelectric MEMS sound transducer, as a microphone, immediately generates an electrical acoustic signal, which can be processed directly by the audio amplifier.

Moreover, it is advantageous when the amplifier unit comprises at least one signal processor, which is connected to the at least one audio amplifier. The audio signal can be preconditioned for sound reproduction with the aid of the signal processor. The signal processor can, for example, filter, pre-amplify, and/or modulate the audio signal, so that the audio amplifier can conduct it to the sound transducer for sound reproduction.

Additionally or alternatively, the acoustic signal can be conditioned for sound recording with the aid of the signal processor. The signal processor can, for example, filter, pre-amplify, modulate, digitize, and/or store the acoustic signal for this purpose as well. The signal processor can also be designed, for example, in such a way that it separates the ambient noise included in the acoustic signal from the music. The signal processor can also generate, for example, the anti-noise appropriate for the ambient noise. The signal processor can also feed the anti-noise to the loudspeaker amplifier, so that the loudspeaker amplifier plays back the music with the anti-noise in order to cancel out the ambient noise.

It is also advantageous when the processor comprises a data link to the at least one audio amplifier. Additionally or alternatively, the processor can also comprise a data link to the at least one signal processor. Via the data link, the emitted audio signals and the detected acoustic signals and the audio data to be processed in the signal processor can be transmitted to the processor. The data link can also be designed as a bidirectional data link, so that data can be conveyed in both directions. Furthermore, the data link can also be designed as a strip conductor of a circuit board.

It is also advantageous when the amplifier unit comprises at least one interface, via which audio signals can be transmitted from the amplifier unit to the sound transducer and acoustic signals can be transmitted from the sound transducer to the amplifier unit, preferably at the same time. Furthermore, the interface can be designed to be wired and/or bidirectional. The interface can be designed, for example, as an audio jack, an RCA connector, an XLR connector, a speakON connector, and/or a USB connection. Due to such an interface, the sound transducer can be detachably connected to the amplifier unit. The interface can also be designed as a soldered connection, however, so that the sound transducer is fixedly connected to the amplifier unit.

It is also advantageous when the amplifier unit is arranged on a single chip. As a result, the amplifier unit can be arranged on a single chip with the audio amplifier, the signal processor, the processor, and/or the data links. The amplifier unit can then be arranged in an ASIC in a particularly space-saving manner.

Moreover, a sound-generating unit comprising a sound transducer, which is operable as a microphone and as a loudspeaker, is provided. The sound-generating unit also comprises an amplifier unit coupled to the sound transducer for sound reproduction and/or for sound recording.

The sound-generating unit can be arranged, for example, in headphones, in headsets, in in-ear headphones, and/or in mobile phones.

The amplifier unit is designed, in this case, according to one or multiple features of the preceding description and/or the following description.

In an advantageous enhanced embodiment of the sound-generating unit, the sound transducer is designed as a simultaneous sound transducer, which, operating as a loudspeaker, can output an audio signal and, at the same time, operating as a microphone, can record an acoustic signal. In this case, "at the same time" can also mean that a listener gets the impression that the simultaneous sound transducer, as a microphone, records sound and, in particular, ambient noise and, simultaneously, operating as a loudspeaker, outputs music and, in particular, anti-noise.

It is very particularly advantageous when the sound transducer is a piezoelectric MEMS sound transducer. The piezoelectric MEMS sound transducer can be designed to be particularly space-saving and has a low power consumption, so that the sound-generating unit can be operated in an energy efficient manner. The piezoelectric MEMS sound transducer can also be particularly easily activated with the aid of the audio signal.

It is also advantageous when the amplifier unit and the sound transducer are arranged on a single chip. As a result, the sound-generating unit can be manufactured as a single component, for example, on an ASIC. In addition, the connection paths between the components, for example, between the processor and the at least one audio amplifier, can be kept short, for example, in an ASIC, so that the processing speed of the audio data is also reduced. When the sound-generating unit is arranged on a single chip, the data links between the components can be formed by simple strip conductors directly on the chip.

It is advantageous when the sound transducer comprises at least one sound transducer unit coupled to a diaphragm of the sound transducer, which can deflect the diaphragm of the sound transducer for sound generation and can detect a deflection of the diaphragm for sound detection. The sound transducer unit can comprise a sound transducer element, which has, for example, piezoelectric properties. As a result, the sound transducer element can be deflected by applying an electrical signal, for example, the audio signal. Additionally, an electrical signal, for example, the acoustic signal, can be generated during a deflection of the sound transducer element. Furthermore, the sound transducer element can be coupled to the diaphragm with the aid of a coupling element, so that the deflections can be transmitted between the sound transducer element and the diaphragm. If the deflections are therefore transmitted from the sound transducer unit onto the diaphragm, sound waves are generated. If the deflections are transmitted from the diaphragm onto the sound transducer unit, the sound waves are detected.

It is also advantageous when the at least one sound transducer unit comprises at least two sound transducer layers, wherein the diaphragm is deflectable with the aid of one sound transducer layer and the deflection of the diaphragm is detectable with the aid of the other sound transducer layer. The one sound transducer layer can be operated as a loudspeaker and the other sound transducer layer can be operated as a microphone. As a result, the sound transducer can be operated as a loudspeaker and as a microphone at the same time or simultaneously with the aid of a sound transducer unit. Moreover, the sound transducer layers can be connected to the at least one audio amplifier. Additionally or alternatively, the sound transducer layers can also be connected to the processor of the amplifier unit. If, for example, the first sound transducer layer is operated as a loudspeaker, it can be connected to the loudspeaker amplifier. Additionally or alternatively, the second sound transducer layer can therefore be operated as a microphone and it can be connected to the microphone amplifier.

Advantageously, the at least two sound transducer layers are arranged one above the other in the direction of the reciprocation axis. As a result, the two sound transducer layers deflect in a uniform manner.

Moreover, it is advantageous when the at least one sound transducer unit is connected to the processor of the amplifier unit, so that the processor can deflect the diaphragm with the aid of the at least one sound transducer unit for sound generation and can detect the deflection for sound detection. As a result, the processor can switch, for example, the sound transducer unit between the operation as a loudspeaker and the operation as a microphone. Additionally or alternatively, at least one of the two sound transducer layers can also be connected to the processor of the amplifier unit, so that the processor can deflect the diaphragm for sound generation and can detect the deflection for sound detection with the aid of at least one of the two sound transducer layers.

Furthermore, it is advantageous when the at least two sound transducer units of the sound transducer are coupled to one another with the aid of a connecting element. For this purpose, the connecting element can be advantageously elastically designed. As a result, for example, the deflections of the one sound transducer unit, which is operated as a loudspeaker, can be transmitted onto the other sound transducer unit, which is operated as a microphone.

It is also advantageous when the sound transducer comprises a limiting element, with the aid of which the diaphragm of the sound transducer is limited in a vibration in at least one direction of the reciprocation axis of the sound transducer. The limiting element is stationary with respect to the diaphragm. The limiting element can be designed, for example, as one piece with a support element of the sound transducer. The limiting element can be arranged, for example, in such a way that the diaphragm impacts the limiting element during a vibration in a direction toward the limiting element. As a result, the vibration is limited in at least one direction along the reciprocation axis. Additionally, the diaphragm can also be connected to the limiting element, so that the vibration of the diaphragm is limited in both directions along the reciprocation axis. For this purpose, the diaphragm can be fixedly bonded, for example, on the limiting element. The limiting element can also comprise a groove, however, into which the diaphragm is slid, so that the vibration of the diaphragm is limited in both directions along the reciprocation axis. The vibration of the diaphragm is limited only in the area of the limiting element, of course. Adjacent to the limiting element, the diaphragm can continue to vibrate. The limiting element divides the diaphragm into two diaphragm areas, however.

It is advantageous when the diaphragm comprises a first diaphragm area and a second diaphragm area, wherein one of the sound transducer units can deflect the diaphragm in the first diaphragm area for sound generation and the other sound transducer unit can detect the deflection of the diaphragm in the second diaphragm area for sound detection. The two diaphragm areas can be separated, for example, by the limiting element. As a result, the sound transducer can be operated as a loudspeaker and as a microphone at the same time or simultaneously. Furthermore, the sound transducer can be operated in this way using a single diaphragm.

Furthermore, the limiting element can be arranged between the at least two sound transducer units. As a result, one sound transducer unit can be arranged in one diaphragm area in each case, so that, for example, the diaphragm in the first diaphragm area can be operated as a loudspeaker and the diaphragm in the second diaphragm area can be operated as a microphone.

BRIEF DESCRIPTION OF THE DRAWINGS

Additional advantages of the invention are described in the following exemplary embodiments. The drawings show in.

DETAILED DESCRIPTION OF EXEMPLARY EMBODIMENTS

Figure 1:
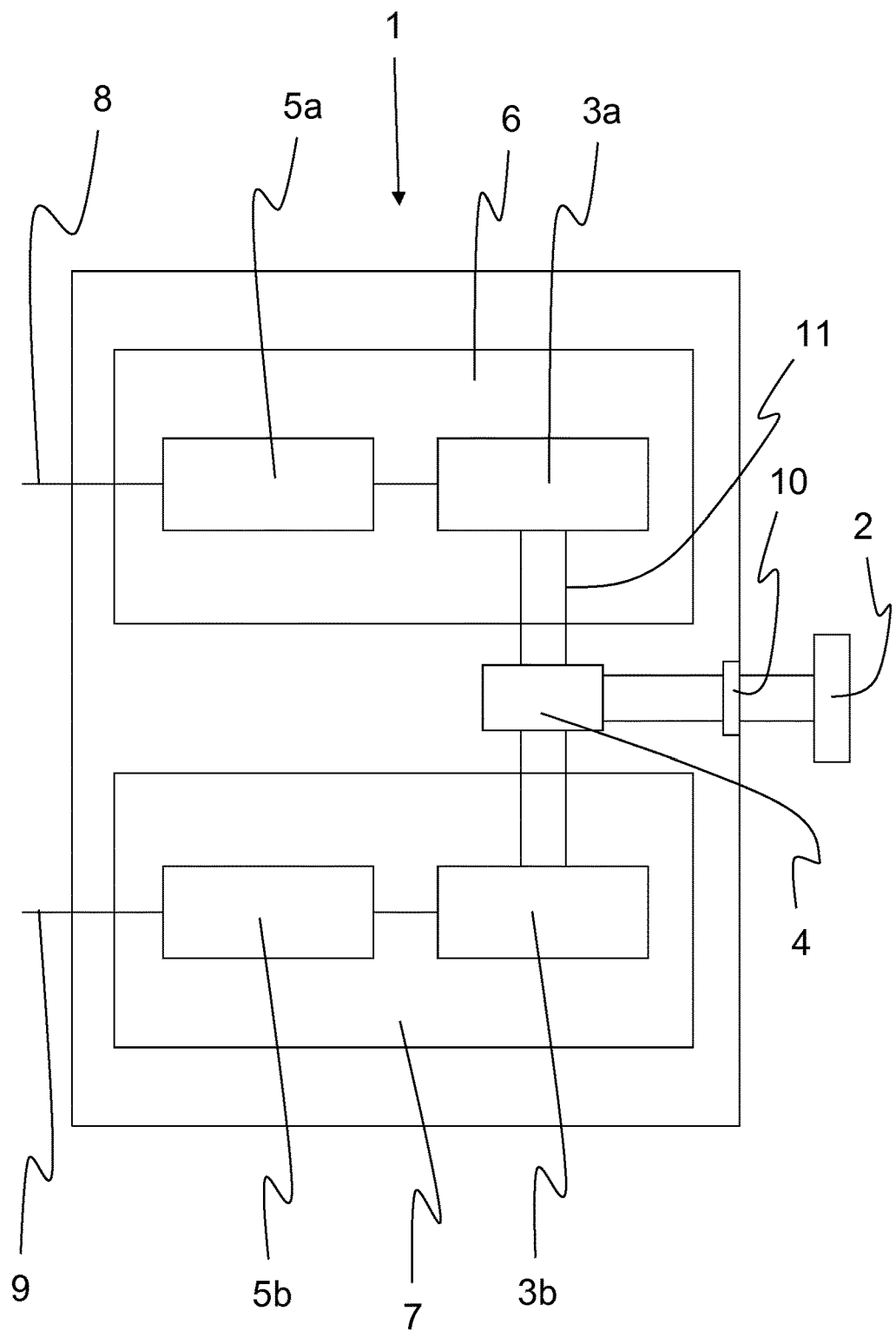
FIG. 1 a block diagram of an amplifier unit comprising two audio amplifiers, a processor, and two signal processors, FIG. 2 a block diagram of an alternative exemplary embodiment of an amplifier unit comprising two audio amplifiers, a processor, and two signal processors, FIG. 3 a block diagram of an alternative exemplary embodiment of an amplifier unit comprising a hybrid audio amplifier, a processor, and two signal processors, FIG. 4 a schematic sectional view of a sound transducer comprising a support element and a diaphragm, FIG. 5 a schematic sectional view of a further exemplary embodiment of a sound transducer, FIG. 6 a schematic sectional view of a further exemplary embodiment of a sound transducer, and FIG. 7 a schematic sectional view of a further exemplary embodiment of a sound transducer.

FIG. 1 shows a block diagram of an amplifier unit 1 for operating a sound transducer 2, comprising two audio amplifiers 3a, 3b, a processor 4, and two signal processors 5a, 5b. In this exemplary embodiment, the audio amplifier 3a is designed as a loudspeaker amplifier, which amplifies an audio signal for the sound transducer 2, so that the sound transducer 2 can be operated as a loudspeaker. In this exemplary embodiment, the audio amplifier 3b is designed as a microphone amplifier, which amplifies an acoustic signal coming from the sound transducer 2, so that the sound transducer 2 can be operated as a microphone.

Moreover, the audio amplifier 3a and the signal processor 5a in this exemplary embodiment are combined to form a loudspeaker unit 6 and the audio amplifier 3b and the signal processor 5b are combined to form a microphone unit 7. For example, the loudspeaker unit 6 and/or the microphone unit 7 can be produced as one component, in particular on a single chip, and are combined to form the amplifier unit 1.

The amplifier unit 1 comprises an audio input 8 for the feed-in of an audio signal, for example, the music and/or the speech, which leads into the loudspeaker unit 6 and/or into the signal processor 5a. Alternatively, the audio input 8 can also conduct the audio signal directly into the loudspeaker amplifier 3a. The audio input 8 can feed, for example, a music signal from an MP3 player, a CD player, and/or a radio signal, for example, from a mobile phone, into the amplifier unit 1.

In order to feed-out the audio signal, the amplifier unit 1 comprises an audio outlet 9, which leads out of the microphone unit 7 and/or away from the signal processor 5b. The audio output 9 can also conduct the music or speech signal to a memory unit and/or to a mobile phone, where it is stored or sent to a conversation partner.

Furthermore, the audio input 8 and the audio output 9 can comprise an interface (not shown here), so that the audio signal can be conducted into and/or out of the amplifier unit 1, for example, in a wired manner.

The amplifier unit 1 comprises an interface 10 so that the sound transducer 2 can be connected to the amplifier unit 1. The interface 10 and/or the interfaces of the audio input 8 and/or of the audio output 9 can be wired and/or bidirectional and/or designed, for example, as an audio jack, an RCA connector, an XLR connector, a speakON connector, and/or a USB connection, so that, for example, the sound transducer 2 can be detachably connected to the amplifier unit 1. Additionally or alternatively, the interfaces can also be optically designed.

Additionally or alternatively, the sound transducer 2 can also be fixedly coupled to the interface 10, for example, with the aid of a soldered connection.

In this exemplary embodiment, the processor 4 is arranged between the audio amplifier 3*a* and the audio amplifier 3*b* and is connected to each of the two audio amplifiers 3*a*, 3*b* with the aid of data links 11 (only one data link is provided with a reference numeral, for the sake of simplicity). Moreover, a data link 11 extends from the processor 4 to the interface 10.

The data link 11 can also be designed to be wired and/or bidirectional. The data link 11 can be designed for transmitting an electrical and/or optical signal. Furthermore, the data link 11 can also be designed as a strip conductor on a circuit board.

The amplifier unit 1 can also be arranged, for example, in headphones, in a headset, in in-ear headphones, in a helmet comprising a loudspeaker or loudspeakers, or in a mobile phone, wherein music, tones, and/or speech can be played back and/or recorded by the sound transducer 2 with the aid of the amplifier unit 1. When music is to be recorded, the sound transducer 2 can be utilized as a microphone. When music is to be played back, the sound transducer 2 can be utilized as a loudspeaker.

With the aid of the amplifier unit 1 according to the invention, an active noise reduction (ANR) method can also be carried out. For this purpose, the amplifier unit 1 is designed in such a way that it can operate the sound transducer 2 simultaneously as a microphone for sound recording and as a loudspeaker for sound reproduction.

In this case, "simultaneously" can also mean that the listener of the music, the tones, or the speech merely gets the impression that the cancellation of the ambient noise with the aid of an anti-noise signal takes place at the same time. For example, due to a finite temporal resolution of human hearing, it can suffice when the cancellation of the ambient noise with the aid of the anti-noise signal takes place within the shortest temporal resolution of human hearing.

With the aid of the processor 4, which can also be designed as a digital signal processor, the sound transducer 2 can be utilized as a microphone at the same time during the sound generation.

For example, the processor 4 can comprise an arithmetic logic unit in which a computer program is run, which processes the sound recorded by the sound transducer 2. The processor 4 can, for example, filter the ambient noise out of the recorded sound. The processor 4 can also form the anti-sound on the basis of the ambient noise, which is played back by the sound transducer 2 together with the music and cancels out the ambient noise. The playback of the music and of the anti-noise can take place at the same time as the recording of the ambient noise, so that the ambient noise is cancelled out essentially immediately by the corresponding anti-noise.

The sound transducer 2, as a microphone, therefore records, for example, music and ambient noise. The amplifier unit 1 isolates the ambient noise and, on the basis thereof, generates a corresponding anti-noise signal. The anti-noise is reproduced, together with the music to be played back, by the sound transducer 2, which is now utilized as a loudspeaker. The anti-noise can be played back with the music by the sound transducer 2 at the same time as the recording of the ambient noise. The anti-noise component of the sound generated in this way destructively interferes with the ambient noise and, as a result, cancels out the ambient noise. All that remains is the music, which is perceived by a listener.

Due to the recording of the sound, which includes, in particular, the ambient noise, and the simultaneous generation of the sound by the single sound transducer 2, the active noise reduction method can be carried out with a high level of quality. The cancellation of the ambient noise with the aid of the corresponding anti-noise takes place with the aid of the one sound transducer 2 at the spot at which the ambient noise is also recorded. As a result, no propagation times between the moment of the recording of the ambient noise and the moment of the reproduction of the anti-noise need to be taken into account in the computation of the anti-noise, and so the anti-noise can be computed faster.

The amplifier unit 1 can also be manufactured on a chip in one manufacturing step, however. For example, the audio amplifiers 3*a*, 3*b*, the processor 4, the signal processors 5*a*, 5*b*, and/or the data links 11 can be arranged on the chip. Additionally or alternatively, the interface 10 and/or the interfaces of the audio input 8 and/or of the audio output 9 can also be arranged on the chip.

Figure 2:
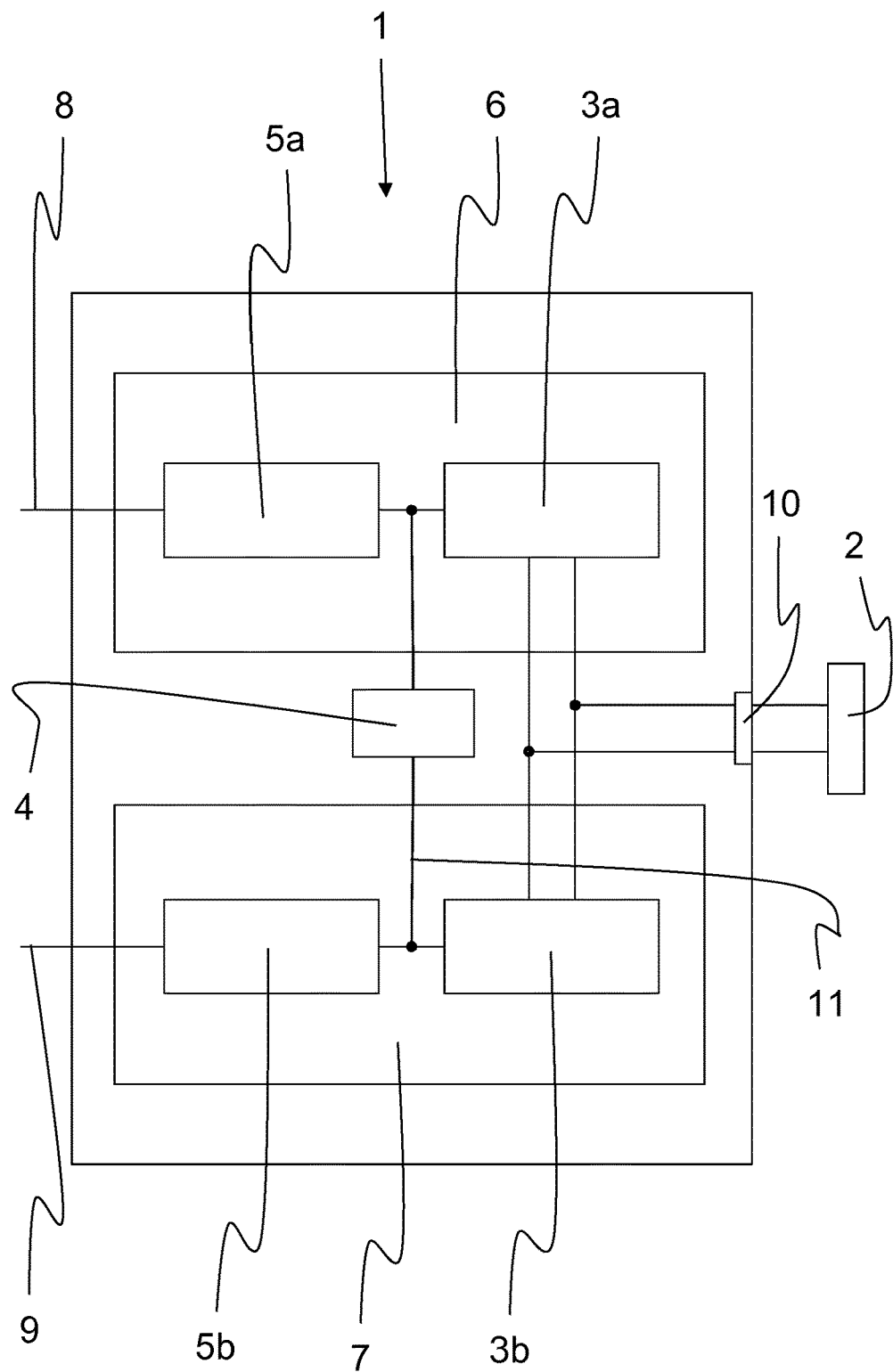

FIG. 2 shows an alternative exemplary embodiment of the amplifier unit 1 in a block diagram. The features and functions identical to those described with respect to FIG. 1 are not described again, from this point forward, for the sake of simplicity. In this exemplary embodiment, the processor 4 is arranged between the loudspeaker unit 6 and the microphone unit 7. The processor 4 comprises a data link 11 to the loudspeaker unit 6 as well as to the microphone unit 7. The processor 4 is coupled between the signal processor 5*a* and the audio amplifier 3*a* with the aid of the data link 11. In addition, the processor 4 is coupled between the signal processor 5*b* and the audio amplifier 3*b* with the aid of the data link 11.

In this exemplary embodiment, the processor 4 can further process the sound, which includes, in particular, the ambient noise and the music, and which has been processed by the audio amplifier 3*b*. In particular, the processor 4 can generate the anti-noise signal on the basis of the ambient noise. The processor 4 can subsequently conduct the anti-noise signal into the loudspeaker unit 6, in which the anti-noise signal is conducted with the aid of the audio amplifier 3*a* to the sound transducer 2 for sound reproduction.

Figure 3:
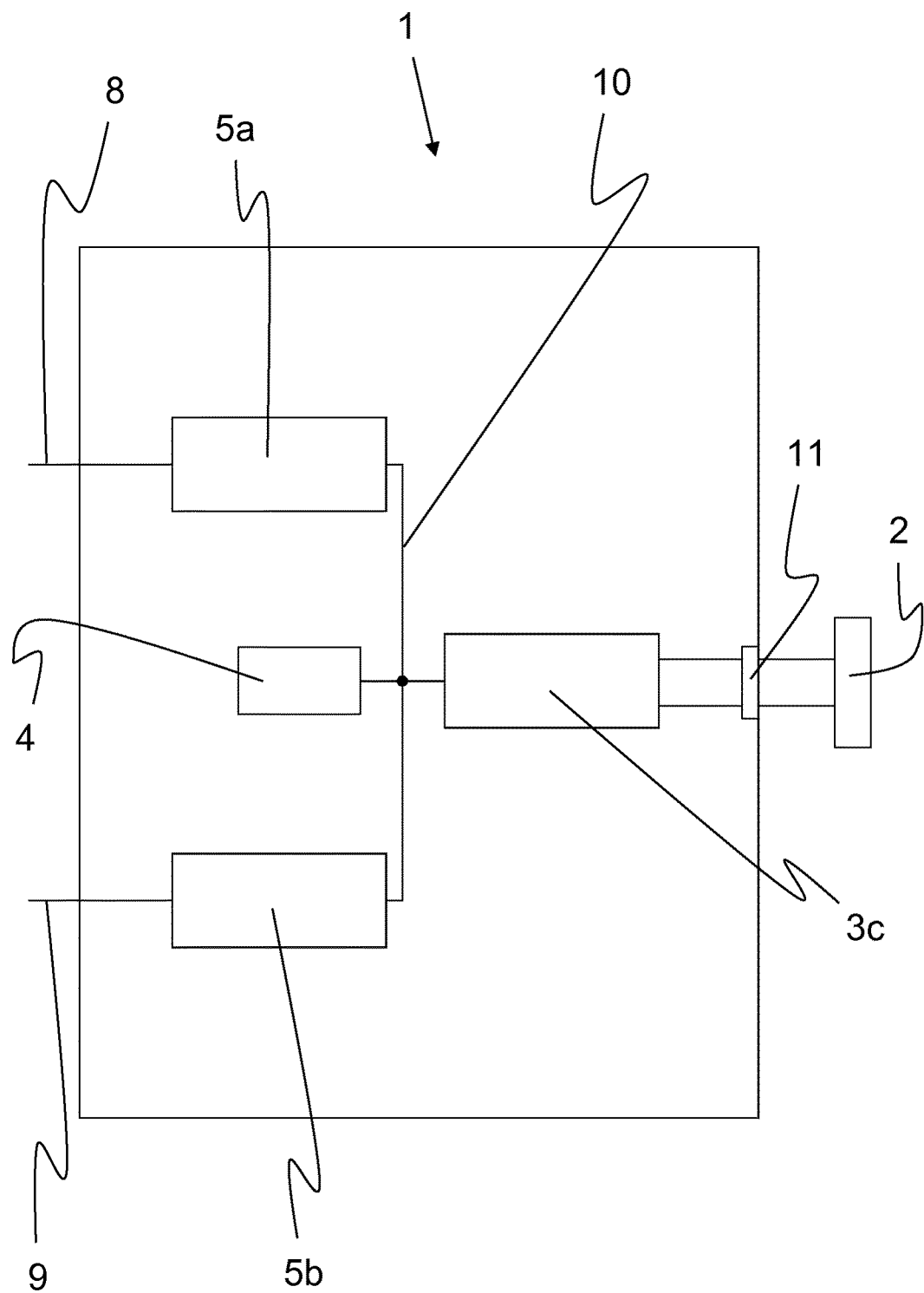

FIG. 3 shows a further alternative exemplary embodiment of the amplifier unit 1 comprising a sound transducer 2, a hybrid audio amplifier 3*c*, a processor 4, and two signal processors 5*a*, 5*b*.

In this exemplary embodiment, the amplifier unit 1 comprises a single hybrid audio amplifier 3*c*, which can amplify the audio signal for sound reproduction, in order to feed the audio signal to the sound transducer 2, and which can process, in particular simultaneously, the audio signal from the sound transducer 2 for sound recording, in order to store the acoustic signal, for example. The hybrid audio amplifier 3c can also, for example, filter the ambient noise out of the recorded acoustic signal and generate the anti-noise signal on the basis thereof. The hybrid audio amplifier 3c can also amplify the anti-noise signal again and conduct it, together with the music, to the sound transducer 2 for sound reproduction.

Additionally or alternatively, the processor 4 can also filter the ambient noise out of the recorded acoustic signal and generate the anti-noise signal.

Figure 4:
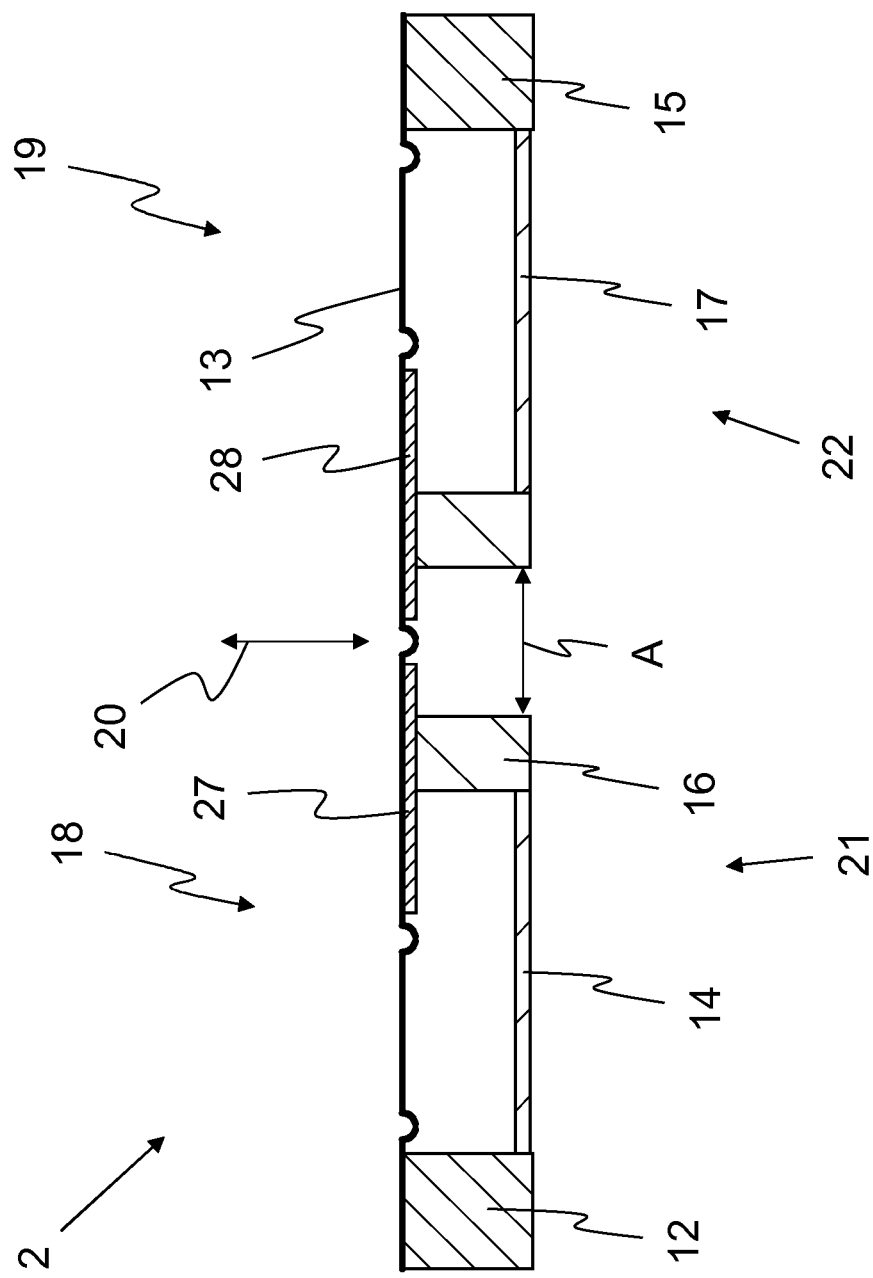

FIG. 4 shows a schematic sectional view of a sound transducer 2 comprising a support element 12 and a diaphragm 13. The sound transducer 2 comprises a support element 12, on which a diaphragm 13 is arranged. With the aid of the diaphragm 13, air situated above the diaphragm 13 can be caused to vibrate, so that sound waves are generated. As a result, the sound transducer 2 is operated as a loudspeaker. Additionally, air above the diaphragm 13, which is vibrating due to the sound waves, can cause the diaphragm 13 to vibrate. As a result, the sound transducer 2 is operated as a microphone. The diaphragm 13 can be deflected along a reciprocation axis 20.

According to the present exemplary embodiment, the sound transducer 2 comprises a first sound transducer unit 21 and a second sound transducer unit 22.

Furthermore, the first sound transducer unit 21 can comprise a first sound transducer element 14, which is connected to the diaphragm 13 in the present case with the aid of a first coupling element 16. The second sound transducer unit 22 can comprise a second sound transducer element 15, which is connected to the diaphragm 13 in the present case with the aid of a second coupling element 17. The two coupling elements 16, 17 can be fixedly connected to the diaphragm 13.

According to the present exemplary embodiment, a coupling plate 27, 28 is arranged between the coupling elements 16, 17, respectively, and the diaphragm 13. Due to the particular coupling plate 27, 28, a planar transmission of the deflection between the diaphragm 13 and the sound transducer unit 21, 22, respectively, can be made possible.

The first sound transducer element 14 and/or the second sound transducer element 15 can comprise, for example, a piezoelectric element, so that an electrical signal can be converted into a deflection of the sound transducer element 14, 15 and/or a deflection of the sound transducer element 14, 15 can be converted into an electrical signal. Since the first sound transducer element 14 and/or the second sound transducer element 15 are/is connected to the diaphragm 13 with the aid of the corresponding coupling element 16, 17, the deflections of the sound transducer elements 14, 15 can be transmitted onto the diaphragm 13 and/or the vibrations of the diaphragm 13 can be transmitted onto the sound transducer elements 14, 15.

Advantageously, for example, the first sound transducer unit 21 can be operated as a loudspeaker. Sound waves can therefore be generated with the aid of the first sound transducer unit 21. Additionally, the second sound transducer unit 22 can be operated as a microphone. The sound waves can therefore be recorded with the aid of the second sound transducer unit 22. The first sound transducer unit 21 can be operated simultaneously with or at the same time as the second sound transducer unit 22, so that sound waves can be generated and detected simultaneously or at the same time with the aid of the sound transducer 2. Since both sound transducer units 21, 22 are coupled to a diaphragm 13, the sound waves can be generated and detected with the aid of the sound transducer 2.

For example, the first sound transducer unit 21 is operated as a loudspeaker, so that sound waves are generated on the basis of an audio signal, which, in turn, can include music, tones, and speech, as well as the anti-noise.

The second sound transducer unit 22 can be operated, for example, as a microphone, so that an acoustic signal is detected on the basis of the sound waves. The detected acoustic signal can comprise two acoustic signal components. A first acoustic signal component can include, for example, the ambient noise. Additionally, a second acoustic signal component can include the speech, the tones, and the music, and/or the anti-noise, which are/is generated at the same time by the first sound transducer unit 21. The detected acoustic signal is therefore composed of the first acoustic signal component and the second acoustic signal component. Since the second acoustic signal component is known, however, since it corresponds to the audio signal generated at the first sound transducer unit 21, this second acoustic signal component can be filtered out of the acoustic signal For example, the second acoustic signal component can be subtracted from the acoustic signal. A difference signal can be ascertained. As a result, the first acoustic signal component, which includes the ambient noise, can be ascertained.

According to the present exemplary embodiment of FIG. 4, the first sound transducer unit 21 is arranged in a first sound transducer area 18. Additionally or alternatively, the second sound transducer unit 22 according to the present exemplary embodiment is arranged in a second sound transducer area 19. The two sound transducer areas 18, 19 can have a distance A from one another. Additionally or alternatively, the two sound transducer units 21, 22 can also have the distance A from one another. Due to the distance A, the coupling elements 16, 17 are also spaced apart from one another, which transmit the deflection between the diaphragm 13 and the corresponding sound transducer elements 14, 15. As a result of the distance A, the two sound transducer units 21, 22 for generating and/or detecting the sound waves have very little effect on one another.

For example, the first sound transducer unit 21 is operated as a loudspeaker, so that sound waves are generated therewith. The coupling element 16 transmits the deflections of the first sound transducer element 14 in the first sound transducer area 18 onto the diaphragm, which forms corresponding vibrations. The second sound transducer unit 22 can be operated as a microphone at the same time as or simultaneously with the first sound transducer unit 21. With the aid of sound waves, the diaphragm 13 in the second sound transducer area 19 is caused to vibrate; the vibrations are transmitted by the coupling element 17 onto the second sound transducer element 15. Therefore, sound waves can be generated and detected at the same time or simultaneously with the aid of a single sound transducer 2.

Alternatively, both sound transducer units 21, 22 can also be operated as a loudspeaker and/or as a microphone. For example, the two sound transducer units 21, 22 can be operated as loudspeakers in a loudspeaker interval and as microphones in a temporally subsequent microphone interval.

Figure 5:
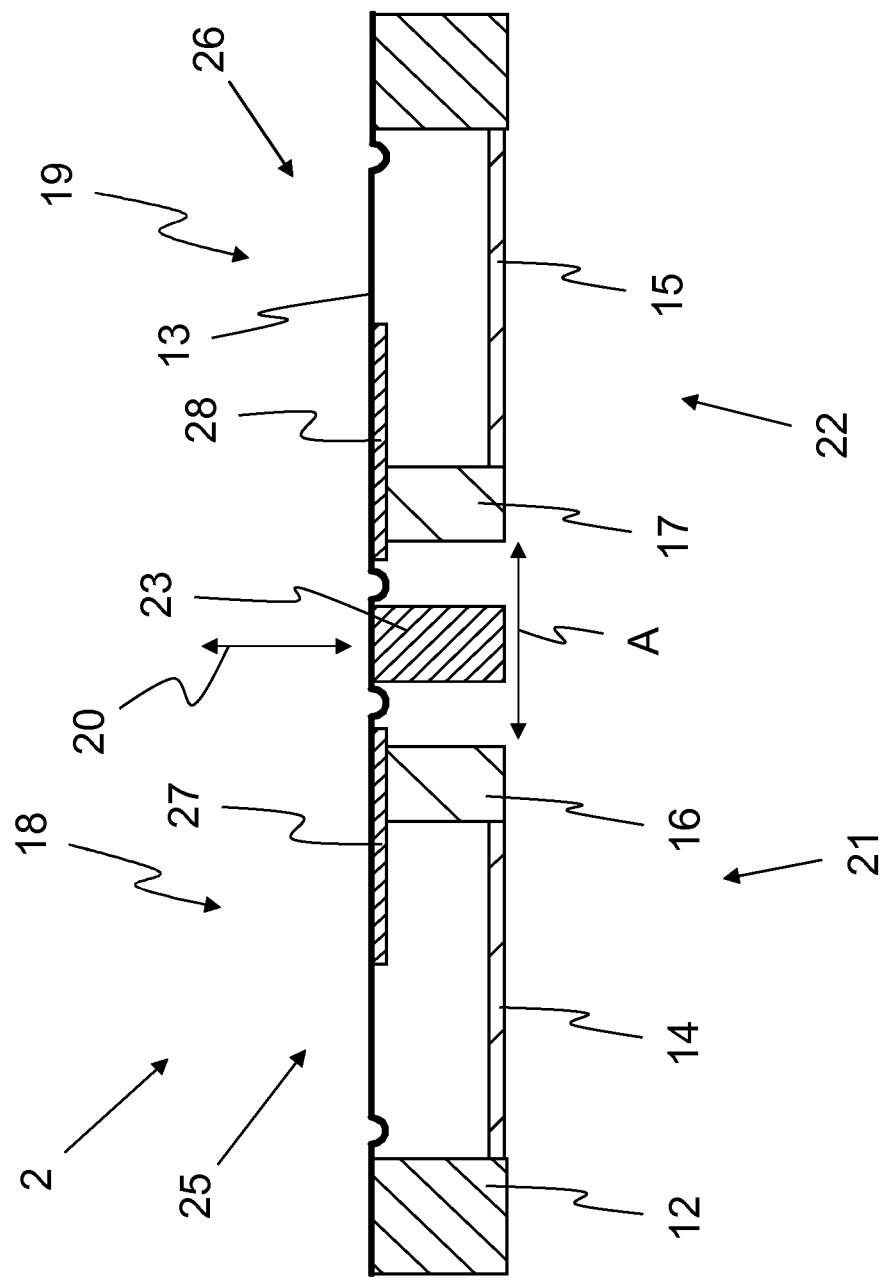

FIG. 5 shows a schematic sectional view of a further exemplary embodiment of a sound transducer 2. For the sake of simplicity, the features that are the same as in the preceding figures will not be explained again.

For example, the diaphragm 13 in the first diaphragm area 25 can be set into vibration with the aid of the first sound transducer unit 21, so that sound waves are generated. The diaphragm 13 is therefore utilized in the first diaphragm area 25 for the loudspeaker function of the sound transducer 2. In the second diaphragm area 26, sound waves can set the diaphragm 13 into vibration; the vibrations can be detected by the second sound transducer unit 22. The diaphragm 13 is therefore utilized in the second diaphragm area 26 for the microphone function of the sound transducer 2.

Moreover, the diaphragm 13 can comprise a first diaphragm area 25 and a second diaphragm area 26. According to the present exemplary embodiment, the two diaphragm areas 25, 26 are arranged adjacent to one another on the diaphragm 13. In this exemplary embodiment of FIG. 5, a limiting element 23 is arranged between the two diaphragm areas 25, 26.

With the aid of the limiting element 23, a deflection of the diaphragm 13 in the area of the limiting element 23 along the reciprocation axis 20 can be limited. For example, the diaphragm 13 can rest, in particular loosely, on the limiting element 23, so that a deflection along the reciprocation axis 20 in the direction of the limiting element 23 is prevented. Additionally or alternatively, the diaphragm 13 can also be connected to the limiting element 23, so that a deflection along the reciprocation axis 20 is limited in both directions. The diaphragm 13 can be adhesively bonded, for example, on the limiting element 23. The limiting element 23 can be designed, for example, as one piece with the support element 12.

The first sound transducer area 18 can be arranged in the first diaphragm area 25 and the second sound transducer area 19 can be arranged in the second diaphragm area 26.

Figure 6:
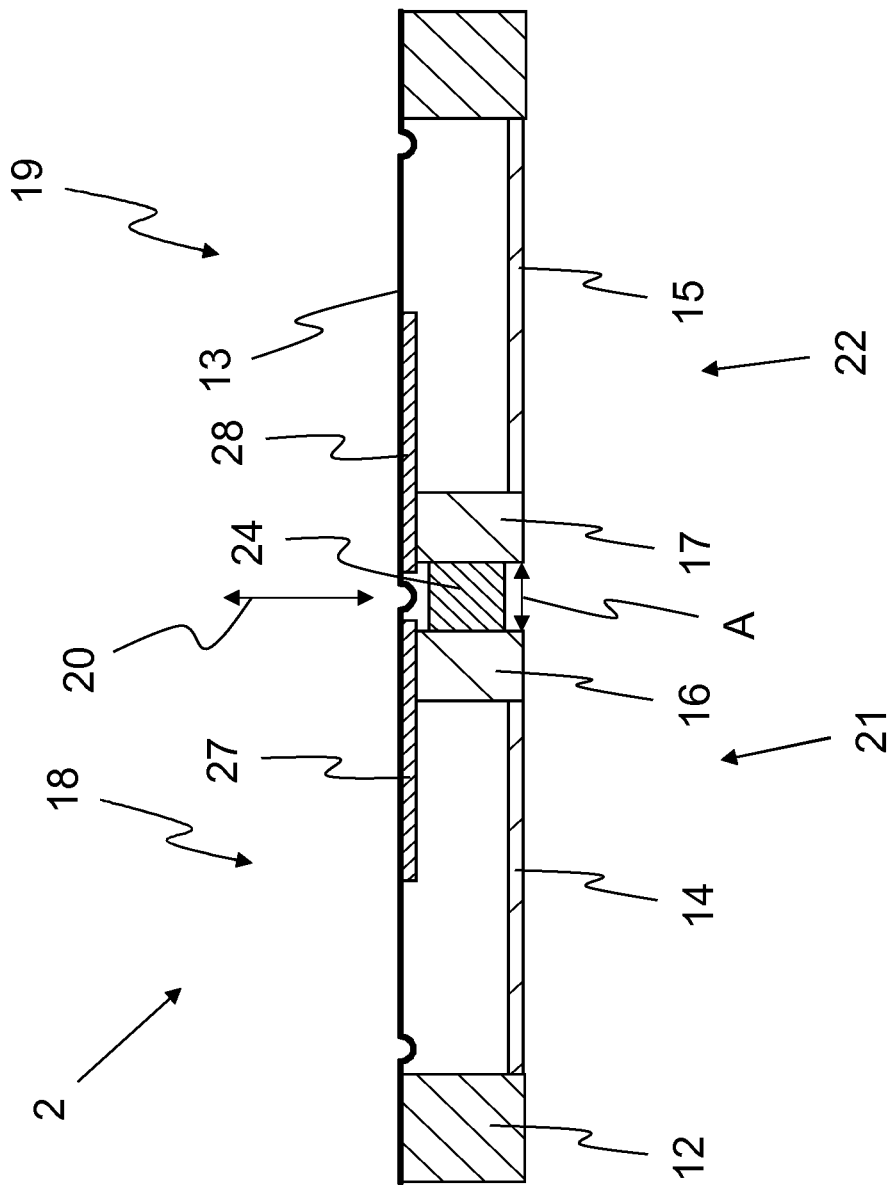

FIG. 6 shows a schematic sectional view of a further exemplary embodiment of a sound transducer 2.

According to the present exemplary embodiment, the two sound transducer units 21, 22 are connected to one another with the aid of a connecting element 24. The connecting element 24 couples the two sound transducer units 21, 22, so that the deflections of the sound transducer units 21, 22 are transmitted onto the particular other sound transducer unit 21, 22. According to the present exemplary embodiment, the connecting element 24 is arranged between the two coupling elements 16, 17 of the two sound transducer units 21, 22, respectively.

Furthermore, the connecting element 24 can be elastically designed, so that a change of the distance A due to the deflection of the sound transducer elements 21, 22 can be compensated for. The connecting element 24 can comprise, for example, a spring element.

Moreover, the first sound transducer unit 21 and/or the second sound transducer unit 22 can be connected to the at least one audio amplifier 3a, 3b. If, for example, the first sound transducer unit 21 is operated as a loudspeaker in order to generate the sound waves, the first sound transducer unit 21 can be connected to the audio amplifier 3a, 3b that is operated as a loudspeaker amplifier. When the first sound transducer unit 21 is operated as a loudspeaker, it can be connected, for example, to the audio amplifier 3a from FIGS. 1 and 2. If, for example, the second sound transducer unit 22 is operated as a microphone, for example, in order to detect the sound waves, the second sound transducer unit 22 can also be connected to an audio amplifier 3a, 3b. If the second sound transducer unit 22 is operated, for example, as a microphone, it can be connected, for example, to the audio amplifier 3b from FIGS. 1 and 2.

Figure 7:
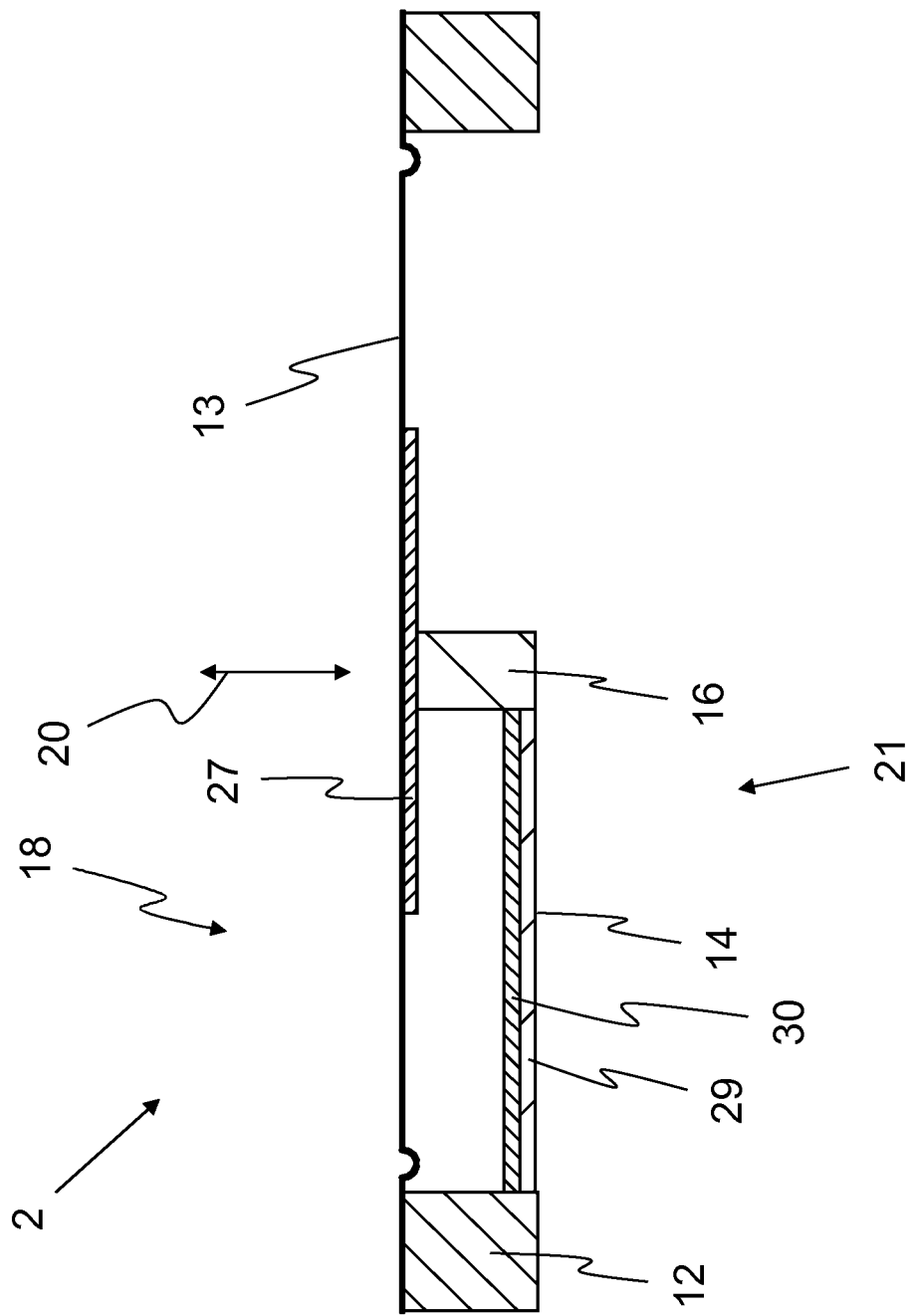

FIG. 7 shows a schematic sectional view of a further exemplary embodiment of a sound transducer 2. According to the present exemplary embodiment, the sound transducer element 14 can comprise a first sound transducer layer 29 and a second sound transducer layer 30. Both sound transducer layers 29, 30 can form the sound transducer element 14 in this case. The two sound transducer layers 29, 30 can be arranged one above the other in the direction of the reciprocation axis 20. The two sound transducer layers 29, 30 can each be designed as a piezoelectric element. The first sound transducer element 14 of the present exemplary embodiment can be formed by two piezoelectric elements arranged one above the other.

It is advantageous when one of the two sound transducer layers 29 or 30 is operated as a loudspeaker in order to generate the sound waves and the other sound transducer layer 29 or 30 is operated as a microphone in order to detect the sound waves. Therefore, the sound waves can be generated with the aid of one sound transducer layer 29 or 30 and the sound waves can be detected with the aid of the other sound transducer layer 29 or 30.

The sound waves can therefore be generated by, for example, the first sound transducer layer 29 and, at the same time or simultaneously therewith, the sound waves can be detected with the aid of the second sound transducer layer 30.

Furthermore, the two sound transducer layers 29, 30 can be connected to the particular audio amplifiers 3a, 3b. The sound transducer layer 29 or 30 that is operated as a loudspeaker can be connected to the respective one of the audio amplifiers 3a, 3b that is operated as a loudspeaker amplifier, and the sound transducer layer 29 or 30 that is operated as a microphone can be connected to the respective one of the audio amplifiers 3a, 3b that is operated as a microphone amplifier.

Alternatively, the sound transducer 2 can also comprise two sound transducer units 21, 22, similarly to the preceding figures, including at least two sound transducer layers 29, 30.

The present invention is not limited to the represented and described exemplary embodiments. Modifications within the scope of the claims are also possible, as is any combination of the features, even if they are represented and described in different exemplary embodiments.

LIST OF REFERENCE NUMERALS 1 amplifier unit
2 MEMS sound transducer
3a, 3b audio amplifier
4 processor
5a, 5b signal processor
6 loudspeaker unit
7 microphone unit
8 audio input
9 audio output
10 interface
11 data link
12 support element
13 diaphragm
14 first sound transducer unit
15 second sound transducer unit
16 first coupling element
17 second coupling element
18 first sound transducer area
19 second sound transducer area
20 reciprocation axis
21 first sound transducer unit
22 second sound transducer unit
23 limiting element 24 connecting element
25 first diaphragm area
26 second diaphragm area
27 first coupling plate
28 second coupling plate
29 first sound transducer layer
30 second sound transducer layer
A distance

The invention claimed is:

1. An amplifier unit for a MEMS sound transducer, which is operable as a microphone and as a loudspeaker, the amplifier unit comprising:
    an audio amplifier for sound reproduction and/or sound recording, and
    a processor connected to the audio amplifier and designed in such a way that the MEMS sound transducer is operable simultaneously as a loudspeaker and as a microphone.

2. The amplifier as in claim 1, wherein the processor is a digital signal processor configured to control the MEMS sound transducer to operate as a microphone at the same time as sound generation.

3. The amplifier unit as in claim 1, further comprising: a filter connected to the processor, and wherein the processor is designed for sound cancellation to control the filter in such a way that the filter can filter out and/or suppress ambient noise on the basis of an emitted audio signal and an acoustic signal detected at the same time with the aid of the MEMS sound transducer.

4. The amplifier unit as claimed in claim 1, wherein the processor is designed in such a way that the processor separates an acoustic signal, which is detected by the MEMS sound transducer operating as a microphone, into a first acoustic signal component representing emitted useful sounds and into a second acoustic signal component representing ambient noise.

5. The amplifier unit as claimed in claim 4, wherein the processor is designed in such a way that the processor generates an anti-noise signal on the basis of the second acoustic signal component and combines the anti-noise signal with an input signal including useful sound to form an audio signal.

6. The amplifier unit as claimed in claim 1, wherein the processor is designed in such a way that the processor can switch the MEMS sound transducer between operation as a loudspeaker and operation as a microphone.

7. The amplifier unit as claimed in claim 1, further comprising a hybrid audio amplifier configured so that an audio signal can be output to the MEMS sound transducer for sound reproduction, and an acoustic signal of the MEMS sound transducer can received for sound recording.

8. The amplifier unit as claimed in claim 7, further comprising a loudspeaker amplifier configured for the sound reproduction of the audio signal, and a microphone amplifier configured for the sound recording of the acoustic signal.

9. The amplifier unit as claimed in claim 8, wherein the loudspeaker amplifier and the microphone amplifier form an audio amplifier configured to operate the MEMS sound transducer.

10. The amplifier unit as claimed in claim 9, further comprising a signal processor connected to the audio amplifier and the aid of which the audio signal can be preconditioned for sound reproduction and/or the acoustic signal can be conditioned for sound recording.

11. The amplifier unit as claimed in claim 1, further comprising a bidirectional interface that is configured to transmit audio signals to the MEMS sound transducer and acoustic signals from the MEMS sound transducer at the same time.

12. A sound-generating unit comprising:
    a MEMS sound transducer, which is configured to be operable as a microphone and as a loudspeaker, and
    an amplifier unit coupled to the MEMS sound transducer and configured for sound reproduction and/or sound recording,
    wherein the amplifier unit includes an audio amplifier configured for sound reproduction and/or sound recording, and wherein the amplifier unit is configured so that the MEMS sound transducer is operable simultaneously as a loudspeaker and as a microphone.

13. The sound-generating unit as claimed in claim 12, wherein the MEMS sound transducer is configured for simultaneous operation as a loudspeaker to output an audio signal and operation as a microphone to record an acoustic signal.

14. The sound-generating unit as claimed in claim 12, wherein the MEMS sound transducer comprises a diaphragm and a sound transducer unit coupled to the diaphragm and configured to deflect the diaphragm for sound generation and configured to detect a deflection of the diaphragm for sound detection.

15. The sound-generating unit as claimed in claim 14, wherein the sound transducer unit comprises two sound transducer layers, wherein the diaphragm is configured to be deflectable with the aid of one the two sound transducer layers and the deflection of the diaphragm is detectable with the aid of the other one of the two sound transducer layers.

16. The sound-generating unit as claimed in claim 14, wherein the MEMS sound transducer comprises a first sound transducer unit coupled to the diaphragm and a second sound transducer unit coupled to the diaphragm, wherein the first sound transducer unit is configured to deflect the diaphragm and the second sound transducer unit is configured to detect the deflection of the diaphragm.

17. The sound-generating unit as claimed in claim 15, wherein the amplifier unit includes a processor connected to the sound transducer unit and/or at least one of the two sound transducer layers, and wherein the processor is configured to deflect the diaphragm for sound generation and configured to detect the deflection for sound detection with the aid of the sound transducer unit and/or at least one of the two sound transducer layers.

18. The sound-generating unit as claimed in claim 16, further comprising an elastic connecting element that connects the first sound transducer unit of the MEMS sound transducer to the second sound transducer unit of the MEMS sound transducer.

19. The sound-generating unit as claimed in claim 14, wherein the sound transducer defines a reciprocation axis and wherein the MEMS sound transducer comprises a limiting element, with the aid of which the diaphragm is limited in the deflection in at least one direction of the reciprocation axis of the sound transducer.

20. The sound-generating unit as claimed in claim 16, wherein the diaphragm comprises a first diaphragm area and a second diaphragm area, wherein the first sound transducer unit is configured to deflect the diaphragm in the first diaphragm area for sound generation, and wherein the second sound transducer unit is configured to detect the deflection of the diaphragm in the second diaphragm area for sound recording.

* * * * *